United States Patent
Kwack et al.

(10) Patent No.: US 8,188,652 B2
(45) Date of Patent: May 29, 2012

(54) ORGANIC LIGHT EMITTING DISPLAY DEVICE AND METHOD OF MANUFACTURING THE SAME

(75) Inventors: Jin-Ho Kwack, Yongin (KR); Min-Chul Suh, Yongin (KR); Jae-Ho Lee, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 13/043,303

(22) Filed: Mar. 8, 2011

(65) Prior Publication Data

US 2011/0148291 A1 Jun. 23, 2011

Related U.S. Application Data

(62) Division of application No. 12/356,453, filed on Jan. 20, 2009, now Pat. No. 7,922,552.

(30) Foreign Application Priority Data

Jun. 10, 2008 (KR) .................. 10-2008-0054301

(51) Int. Cl.
*H01J 1/62* (2006.01)
*H05B 33/00* (2006.01)

(52) U.S. Cl. .......... 313/504; 313/506; 313/512
(58) Field of Classification Search .......... 313/504, 313/506, 512; 445/23–25
See application file for complete search history.

(56) References Cited

U.S. PATENT DOCUMENTS 7,922,552 B2 4/2011 Kwack et al.

FOREIGN PATENT DOCUMENTS

| JP | 2001-230072 | 8/2001 |
| KR | 1020030087940 | 11/2003 |
| KR | 1020050018401 | 2/2005 |
| KR | 100645715 | 11/2006 |
| KR | 1020080039569 | 5/2008 |

*Primary Examiner* — Joseph L Williams
(74) *Attorney, Agent, or Firm* — Knobbe, Martens, Olson & Bear, LLP

(57) ABSTRACT

Provided is a method of manufacturing an organic light emitting display device in which a laser beam is used. The method includes forming an organic light emitting unit on a substrate; forming a sealing unit that seals the organic light emitting unit; forming an protective film which is opaque on the sealing unit to protect the organic light emitting unit or the sealing unit by blocking the transmission of the laser beam; forming an optical pattern on the opaque protective film using the laser beam; and forming a transparent film from the opaque protective film by oxidizing the opaque protective film.

8 Claims, 2 Drawing Sheets

ORGANIC LIGHT EMITTING DISPLAY DEVICE AND METHOD OF MANUFACTURING THE SAME

CROSS-REFERENCE TO RELATED PATENT APPLICATION

This application is a divisional of U.S. patent application Ser. No. 12/356,453, filed Jan. 20, 2009, entitled ORGANIC LIGHT EMITTING DISPLAY DEVICE AND METHOD OF MANUFACTURING THE SAME which claims the benefit of Korean Patent Application No. 10-2008-0054301, filed on Jun. 10, 2008, in the Korean Intellectual Property Office, the disclosure of which is incorporated herein in its entirety by reference.

BACKGROUND OF THE INVENTION

1. Field of the Invention

The present invention relates to an organic light emitting display device and a method of manufacturing the same, and more particularly, to an organic light emitting display device that can prevent the organic light emitting display device from being damaged by a laser which is used in the manufacturing process and a method of manufacturing the same.

2. Description of the Related Art

Generally, flat panel display (FPD) devices can be classified into devices that use inorganic material and devices that use organic material. Devices that use inorganic material include plasma display panels (PDPs) that use photo luminescence (PL) and field emission displays (FEDs) that use cathode luminescence (CL). Devices that use an organic material include liquid crystal crystals (LCDs) and organic light emitting diodes (OLED).

An OLED includes a pixel electrode and a facing electrode which face each other, and a light emitting layer interposed between the pixel electrode and the facing electrode. The OLED is easily damaged by materials such as moisture or oxygen if they penetrate into the device, and thus, the OLED is sealed so that the impurities cannot penetrate.

Organic light emitting display device that uses the OLED element has a response speed higher than that of a liquid crystal display (LCD) which is currently widely in commercial use, and thus, they can realize superior motion images, are emissive, have wide viewing angles, and have high brightness. Thus, organic light emitting display device that uses the OLED element is expected to be the next generation of display device.

SUMMARY OF THE INVENTION

To address the above and/or other problems, the present invention provides an organic light emitting display device in which an organic light emitting unit or a sealing unit is protected from a laser used in the process of manufacturing the organic light emitting display device and a method of manufacturing the same.

According to an aspect of the present invention, there is provided a method of manufacturing an organic light emitting display device, in which a laser beam is used, the method comprising: forming an organic light emitting unit on a substrate; forming a sealing unit that seals the organic light emitting unit; forming an protective film which is opaque on the sealing unit to protect the organic light emitting unit or the sealing unit by preventing the transmission of the laser beam therethrough; forming an optical pattern on the opaque protective film using the laser beam; and forming a transparent film from the opaque protective film by oxidizing the opaque protective film.

The protective film may be formed of a material that is opaque in an oxygen-free atmosphere and may be transparent after reacting with oxygen.

The protective film may be formed of a metal that is opaque in an oxygen-free atmosphere and is transparent after reacting with oxygen.

The protective film may be formed of Calcium or Lithium.

The forming of the protective film may comprise forming the protective film in an oxygen-free atmosphere.

The forming of the protective film may comprise forming the protective film using a deposition method.

The forming of the optical pattern may comprise forming the optical pattern in an oxygen-free atmosphere.

The forming of the optical pattern may comprise forming the optical pattern using a laser induced thermal imaging (LITI).

The optical pattern may be a color filter or light absorption layer.

The forming of the transparent film may comprise exposing the protective film to oxygen or to air.

The sealing unit may comprise at least two layers.

The sealing unit may have a structure in which an organic layer and an inorganic layer are alternately stacked.

According to another aspect of the present invention, there is provided an organic light emitting display device comprising: a substrate; an organic light emitting unit formed on the substrate; a sealing unit sealing the organic light emitting unit; a protective film formed on the sealing unit; and an optical pattern formed on the protective film using a laser beam, wherein the protective film protects the organic light emitting unit or the sealing unit by preventing transmission of the laser beam therethrough.

The protective film may be formed of a material that is opaque in an oxygen-free atmosphere and is transparent after reacting with oxygen.

The protective film may be formed of a metal that is opaque in an oxygen-free atmosphere and is transparent after reacting with oxygen.

The protective film may be formed of Calcium or Lithium.

The protective film may reflect the laser beam in an oxygen-free atmosphere and be transparent after reacting with oxygen.

The optical pattern may be a color filter or a light absorption layer in an oxygen-free atmosphere.

The sealing unit may comprise at least two layers.

The sealing unit may have a structure in which an organic layer and an inorganic layer are alternately stacked.

According to the organic light emitting display device and method of manufacturing the same as described above, a sealing unit or an organic light emitting unit can be protected from a laser used in the process of manufacturing the organic light emitting display device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
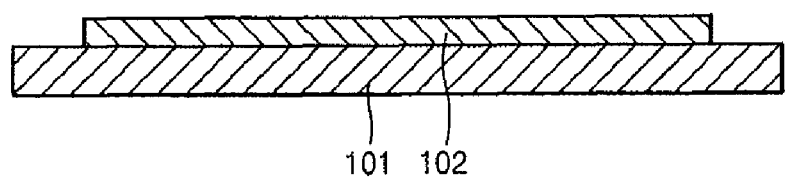
FIGS. 1 through 5 are cross-sectional views illustrating a method of manufacturing an organic light emitting display device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

FIGS. 1 through 5 are cross-sectional views illustrating a method of manufacturing an organic light emitting display device according to an embodiment of the present invention.

Referring to FIG. 1, an organic light emitting unit 102 is formed on a substrate 101.

The substrate 101 can be formed of a material such as transparent glass, plastic sheet, or silicon. The substrate 101 may be flexible or non-flexible and may be transparent or non-transparent. Also, the substrate 101 can be a metal plate.

The organic light emitting unit 102 can be formed on the substrate 101. The organic light emitting unit 102 includes a plurality of light emitting devices (OLEDs). Each of the OLEDs includes a pixel electrode, a facing electrode facing the pixel electrode, and an intermediate layer that includes at least one light emitting layer interposed, between the pixel electrode and a facing electrode. The pixel electrode can be a transparent electrode or a reflection electrode. If the pixel electrode is a transparent electrode, the pixel electrode can be formed of ITO, IZO, ZnO, or $In_2O_3$, and if the pixel electrode is a reflection electrode, the pixel electrode can include a reflection film formed of Ag, Mg, Al, Pt, Pd, Au, Ni, Nd, Ir, Cr or a compound of these materials and a film formed of ITO, IZO, ZnO, or $In_2O_3$ on the reflection film. The facing electrode can also be a transparent electrode and a reflection electrode. If the facing electrode is a transparent electrode, the facing electrode can include a film deposited using Li, Ca, LiF/Ca, LiF/Al, Al, Mg or a compound of these materials to face the intermediate layer interposed between the pixel electrode and the facing electrode, and an auxiliary electrode or a bus electrode line formed of the material used to form the transparent electrode, such as ITO, IZO, ZnO, or $In_2O_3$ on the film. If the facing electrode is a reflection electrode, the facing electrode can be formed of Li, Ca, LiF/Ca, LiF/Al, Al, Mg, or a compound of these materials. The intermediate layer interposed between the pixel electrode and the facing electrode can be formed of a small molecular weight organic material or a polymer organic material. If the intermediate layer is formed of a small molecular weight organic material, the intermediate layer can be formed by stacking a hole injection Layer (HIL), a hole transport layer (HTL), an emission layer (EML), an electron transport layer (ETL), or an electron injection layer (EIL) in a single structure or a composite structure, and can be formed of various materials such as copper phthalocyanine (CuPc), N,N'-di(naphthalene-1-yl)-N,N'-diphenyl-benzidine (NPB), or tris-8-hydroxyquinoline aluminum (Alq3). The intermediate layer formed of a small molecular weight organic material can be formed using a vacuum evaporation method. If the intermediate layer is formed of a polymer organic material, the intermediate layer can have a structure in which an HTL and an EML are included, and the HTL can be formed of a polymer organic material such as poly-(2,4)-ethylene-dihydroxy thiophene (PEDOT), and the EML can be formed of a polymer organic material such as a poly-phenylenevinylene (PPV) group, or a polyfluorene group.

Figure 2:
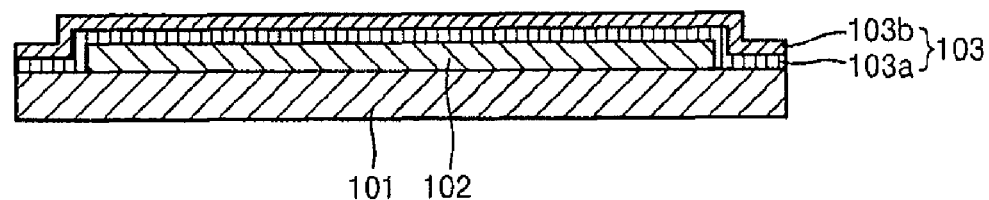

Next, referring to FIG. 2, a sealing unit 103 covering the organic light emitting unit 102 is formed. The OLED of the organic light emitting unit 102 can be easily degraded by a material such as moisture or oxygen. Thus, since the sealing unit 103 covers the organic light emitting unit 102, penetration of moisture or oxygen into the organic light emitting unit 102 can be prevented, thereby preventing degradation of the OLED.

The sealing unit 103 can include at least two layers, that is, can have a structure in which an organic layer 103a and an inorganic layer 103b are alternately stacked. If the sealing unit 103 is formed using only the organic layer 103a or only the inorganic layer 103b, moisture or oxygen can penetrate from the outside through minute paths formed in the protective film. Therefore, the sealing unit 103 can be formed to include multiple thin film layers using a structure in which organic-inorganic composite layers (the organic layer 103a and the inorganic layer 103b) are alternately deposited. If the organic-inorganic composite layers are used, the organic layer 103a can be formed of an acryl group material and the inorganic layer 103b can be formed of a material such as aluminium oxide.

Figure 3:
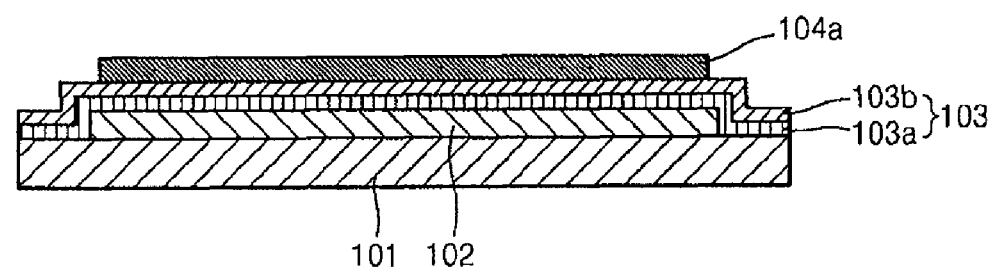

Referring to FIG. 3, a protective film 104a is formed on the sealing unit 103. The protective film 104a is formed of a material that is opaque in an oxygen-free atmosphere and is transparent when it is oxidized by reacting with oxygen. Thus, the protective film 104a formed in an oxygen-free atmosphere is opaque. An oxygen-free atmosphere can comprise an atmosphere completely devoid of oxygen or an atmosphere having insufficient quantities of oxygen to oxidize the protective film. Since the protective film 104a which is opaque is formed on the sealing unit 103 in an oxygen-free atmosphere, the opaque protective film 104a blocks the transmission of a laser beam in a process in which a laser beam is used. In this manner, the protective film 104a protects the organic light emitting unit 102 and the sealing unit 103 from the laser beam, which will be described later. The protective film 104a for protecting the organic light emitting unit 102 and the sealing unit 103 can be formed to cover the sealing unit 103.

The protective film 104a can be formed of a material that is opaque in an oxygen-free atmosphere and is transparent when the material reacts with oxygen. In particular, the protective film 104a can be formed of a metal that is opaque in an oxygen-free atmosphere and is transparent after it is oxidized. Such metal includes Ca and Li. Thus, the opaque protective film 104a can be formed by depositing Ca or Li on the sealing unit 103 in an oxygen-free atmosphere. After the protective film 104a is formed, the opaque state of the protective film 104a is maintained by maintaining the oxygen-free atmosphere.

Figure 4:
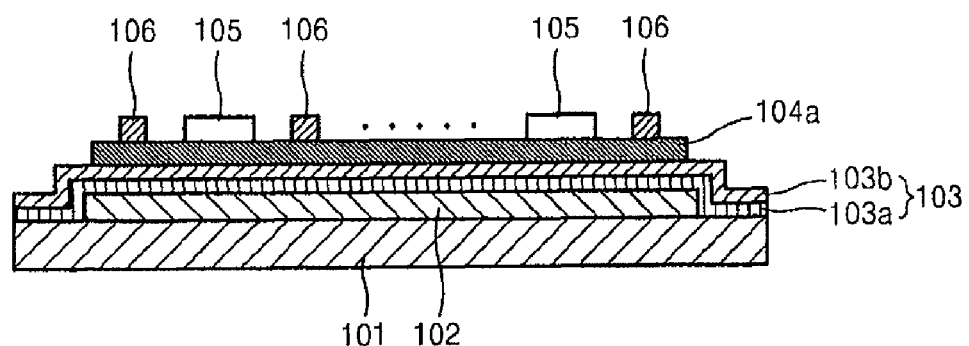

Referring to FIG. 4, optical patterns 105 and 106 are formed on the protective film 104a. The optical patterns 105 and 106 can be formed on the protective film 104a using a laser. The optical patterns 105 and 106 can be, for example, a color filter 105 or a light absorption layer 106. The optical patterns 105 and 106 such as the color filter 105 or the light absorption layer 106 can be formed using a laser induced thermal imaging method.

The laser induced thermal imaging (LITI) requires at least a laser radiating device, an acceptor substrate, and a donor film. The donor film includes a base film, a light-to-heat conversion layer, and a transfer layer. In the LITI, after laminating the donor film onto the entire acceptor substrate in a state that the transfer layer is disposed to face the acceptor substrate, a laser beam is irradiated onto the base film. The laser beam radiated onto the base film is absorbed by the light-to-heat conversion layer and is converted to heat energy, and the transfer layer is transferred to the acceptor substrate due to the heat energy. As a result, a transfer layer pattern is formed on the acceptor substrate.

If the color filter 105 is formed using LITI, the substrate 101 on which the organic light emitting unit 102, the sealing unit 103, and the protective film 104a are stacked performs as the acceptor substrate, and a material for forming the color filter 105 is the transfer layer of the donor film.

The formation of the color filter 105 using the LITI can be achieved by transferring the color filter 105 onto the opaque protective film 104a by irradiating a laser beam towards a pixel region of the organic light emitting unit 102 after the color filter 105 is located in the pixel region of the organic light emitting unit 102. In this case, the opaque protective film 104a prevents the laser beam from being transmitted to the sealing unit 103 or the OLED of the organic light emitting unit 102, which are formed under the opaque protective film 104a, and thus, damage to the sealing unit 103 or the OLED element can be prevented.

The light absorption layer 106 can be a black matrix (BM). The light absorption layer 106 is formed in a non-light emitting region of the organic light emitting unit 102, and can increase contrast and color purity of pixels by blocking light generated from light emitting regions of the organic light emitting unit 102. The light absorption layer 106 can also be formed using the laser induced thermal imaging method. If the light absorption layer 106 is formed using the laser induced thermal imaging method, after the light absorption layer 106 is located on a non-light emitting region of the organic light emitting unit 102, a laser beam is irradiated towards the organic light emitting unit 102 so that the light absorption layer 106 can be transferred onto the opaque protective film 104a. The light absorption layer 106, unlike the color filter 105, is formed on the protective film 104a corresponding to the non-light emitting region and is not formed on the light emitting region of the organic light emitting unit 102. However, since the laser beam is irradiated towards the organic light emitting unit 102, the OLED which is in the light emitting region of the organic light emitting unit 102 can be damaged. Since the protective film 104a according to the present invention blocks the transmission of a laser beam, the protective film 104a can also protect the sealing unit 103 or the OLED of the organic light emitting unit 102 from the laser beam in a process of forming the light absorption layer 106 using the laser beam.

Figure 5:
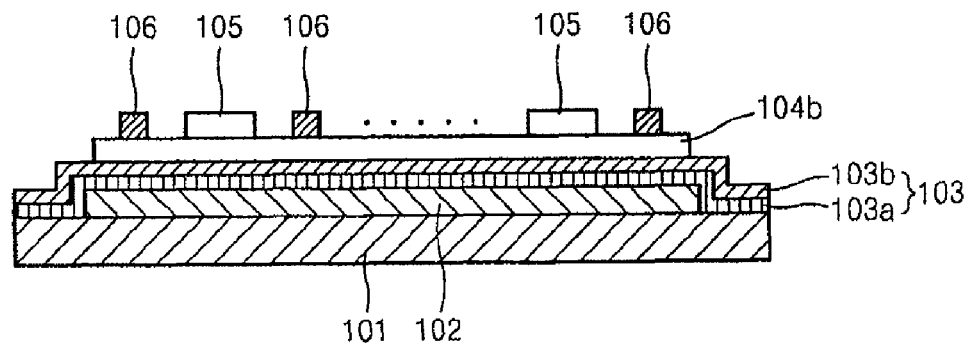

Next, referring to FIG. 5, a transparent film 104b is formed by oxidizing the protective film 104a. The transparent film 104b is formed by exposing the protective film 104a to an oxygen atmosphere or to air with sufficient oxygen to oxidize the protective film 104a. The protective film 104a is opaque in an oxygen-free atmosphere, and is transparent when it reacts with oxygen, and thus, if the protective film 104a is exposed to an oxygen atmosphere or to air, it is oxidized by reaction with oxygen, and thus the opaque protective film 104a is converted into the transparent film 104b. If the protective film 104a is formed of a metal that is opaque in an oxygen-free atmosphere and is transparent after reacting with oxygen, the transparent film 104b is a metal oxide film. In particular, if the protective film 104a is formed of a metal such as Ca or Li, the transparent film 104b is CaO or LiO. Since the transparent film 104b is transparent, a top emission type organic light emitting display device can be realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device comprising:
   a substrate;
   an organic light emitting unit formed on the substrate;
   a sealing unit sealing the organic light emitting unit;
   a protective film formed on the sealing unit; and
   an optical pattern formed on the protective film using a laser beam,
   wherein the protective film protects the organic light emitting unit or the sealing unit by preventing transmission of the laser beam therethrough.

2. The device of claim 1, wherein the protective film is formed of a material that is opaque in an oxygen-free atmosphere and is transparent after reacting with oxygen.

3. The device of claim 2, wherein the protective film is formed of a metal that is opaque in an oxygen-free atmosphere and is transparent after reacting with oxygen.

4. The device of claim 3, wherein the protective film is formed of Calcium or Lithium.

5. The device of claim 1, wherein the protective film reflects the laser beam in an oxygen-free atmosphere and is transparent after reacting with oxygen.

6. The device of claim 1, wherein the optical pattern is a color filter or a light absorption layer in an oxygen-free atmosphere.

7. The device of claim 1, wherein the sealing unit comprises at least two layers.

8. The device of claim 7, wherein the sealing unit has a structure in which an organic layer and an inorganic layer are alternately stacked.

* * * * *